United States Patent [19]
Fry et al.

[11] 3,986,117
[45] Oct. 12, 1976

[54] DEVICE FOR ADJUSTING LASER SYSTEM PULSE FORMING NETWORK VOLTAGE ON REPLACEMENT OF POWER SUPPLY OR RECEIVER TRANSMITTER UNIT

[75] Inventors: Stephen M. Fry, Woodland Hills; Himeo B. Masuda, Gardena, both of Calif.

[73] Assignee: The United States of America as represented by the Secretary of the Army, Washington, D.C.

[22] Filed: Nov. 13, 1975

[21] Appl. No.: 631,797

[52] U.S. Cl. ............................ 324/133; 331/94.5 R
[51] Int. Cl.² ....................................... G01R 19/16
[58] Field of Search ............... 324/51, 73, 133, 72, 324/157; 340/248 A, 248 B, 248 C; 331/94.5 R; 325/363

[56] References Cited
UNITED STATES PATENTS

| | | |
|---|---|---|
| 3,417,326 | 12/1968 | Harris .................................... 324/51 |
| 3,428,888 | 2/1969 | Nolte ..................................... 324/51 |
| 3,437,916 | 4/1969 | Mazurkevics ..................... 324/133 X |
| 3,457,560 | 7/1969 | McKinley .............................. 340/248 |
| 3,467,867 | 9/1969 | Armes et al. ...................... 324/51 X |
| 3,543,111 | 11/1970 | Harris et al. ...................... 324/51 X |
| 3,562,640 | 2/1971 | Wright et al. ......................... 324/51 |
| 3,798,542 | 3/1974 | Dempsey ............................ 324/133 |

*Primary Examiner*—Gerard R. Strecker
*Attorney, Agent, or Firm*—Nathan Edelberg; A. Victor Erkkila; Max Yarmovsky

[57] ABSTRACT

A test device is used in combination with two selectable resistors to indicate when the pulse forming network voltage of a tank laser range finder system is properly adjusted. The test device utilizes a precision temperature compensated current source, an operational amplifier, and a comparator and a lamp driver circuit, electrically coupled intermediate a pulse forming network power supply and a receiver transmitter unit, to indicate overvoltage, undervoltage and null conditions.

5 Claims, 2 Drawing Figures

3,986,117

DEVICE FOR ADJUSTING LASER SYSTEM PULSE FORMING NETWORK VOLTAGE ON REPLACEMENT OF POWER SUPPLY OR RECEIVER TRANSMITTER UNIT

GOVERNMENTAL INTEREST

The invention described herein may be manufactured, used and licensed by or for the Government for governmental purposes without the payment to us of any royalty thereon.

BACKGROUND OF THE INVENTION

Various means have been used in the prior art to readjust the pulse forming network (PFN) voltage of a laser power supply (P/S) in a tank laser range finder system, whenever it became necessary to replace the receiver/transmitter unit (R/T) or the electronics unit (E/U) in order to insure a particular output energy. One of the problems in the past occurred when the PFN voltage of a new laser power supply was inadvertently adjusted too high and the laser fired. Under these conditions the increased energy to the laser often caused serious damage to the tank range finder optics. Additional problems relating to laser equipment are frequently encountered because of the wide variations found in laser efficiency due to differences in flash lamps, laser rod characteristics and varying optical losses. Thus in order to insure a particular output energy in prior art devices, the input energy had to be individually adjusted for each laser. Since the input energy stored in a PFN is generally given by the equation $E = CV^2/2$, and since the PFN capacitance, C, is usually kept constant for a given power supply unit, the PFN voltage, V, is therefore the only parameter which may be easily adjusted to vary the laser energy output. In the past the PFN voltage of a system was normally set by adjusting a variable potentiometer control element on the PFN power supply. However, one of the problems with prior art PFN voltage power supplies has been that there was no easy method of determining in advance exactly where the potentiometer should be set after either a receiver/transmitter unit or electronic unit had been replaced. The aforementioned problems are particularly critical in laser power supplies which utilize thermistor control elements for compensating for a change in laser efficiency as a function of varying ambient temperatures.

The problem of using an instrument such as an optical power meter to determine whether a PFN voltage setting is correct is that some laser firing devices, such as those used in armored vehicles, have protective ballistic covers thereon which preclude the easy attachment of an optical test set. The problem with the prior art method of first adjusting the PFN voltage potentiometer to its lowest setting and then turning the potentiometer setting higher, while firing the laser until the malfunction indication of low energy condition is extinguished, and then further adjusting the potentiometer upwards a particular number of turns, is that there is susbstantial variation in the linearity of potentiometers and of such magnitude to make the malfunction indicating points very uncertain. The prior art method for proper adjustment of PFN voltage for a tank laser range finder system generally necessitated removal of both the electronic unit and the receiver/transmitter unit regardless of which needed repair. The repaired system was then connected to a test set and adjusted for proper laser energy output. This aforedescribed method was both time consuming and laborius.

SUMMARY OF THE PRESENT INVENTION

The present invention relates to a device for adjusting the pulse forming network voltage on a tank laser range finder system, that has had its power supply and/or receiver/transmitter unit replaced, without requiring the laser to be test fired. A thermistor, located in the R/T unit to sense ambient temperature and used in conjunction with a temperature programming circuit located in the P/S unit to vary the PFN voltage to keep laser output energy constant, is bypassed by the present device and replaced by an equivalent resistance which programs the PFN charge power supply for its nominal voltage at an ambient temperature of 25°C. After a resistance proportional to laser efficiency is selected and placed in the R/T unit, and a resistance proportional to the PFN capacitance is selected and placed in the power supply unit, currents flowing through these resistors are compared by an operational amplifier to a PFN sense current, which is proportional to the PFN voltage, and a reference current. An operator by observing a visual indicator can vary PFN adjust potentiometers on the power supply unit to adjust for the proper PFN voltage. An operational amplifier dual comparator circuit is used in place of a null meter to drive lamps which indicate high voltage, low voltage, and null conditions.

An object of the present invention is to provide a test apparatus for adjusting the pulse forming network voltage of a tank laser range finder system without having to fire the laser after replacement of a receiver transmitter unit or a power supply unit.

Another object of the present invention is to provide a test device for adjusting the pulse forming network voltage of a tank laser range finder system without having to use an optical power meter to test the energy output.

Another object of the present invention is to provide a device for adjusting the pulse forming network voltage of a tank laser range finder system without having to remove any tank ballistic covers.

A further object of the present invention is to provide an apparatus which eliminates the necessity of removing both the power supply unit and receiver/transmitter unit of a tank laser range finder system regardless of which needs repair in order to adjust the pulse forming network voltage.

For a better understanding of the present invention, together with other and further objects thereof, reference is made to the following descriptions taken in connection with the accompanying drawings.

BRIEF DESCRIPTION OF THE DRAWINGS

Throughout the following description like reference numerals are used to denote like parts of the drawings.

DESCRIPTION OF THE PREFERRED EMBODIMENTS

Figure 1:
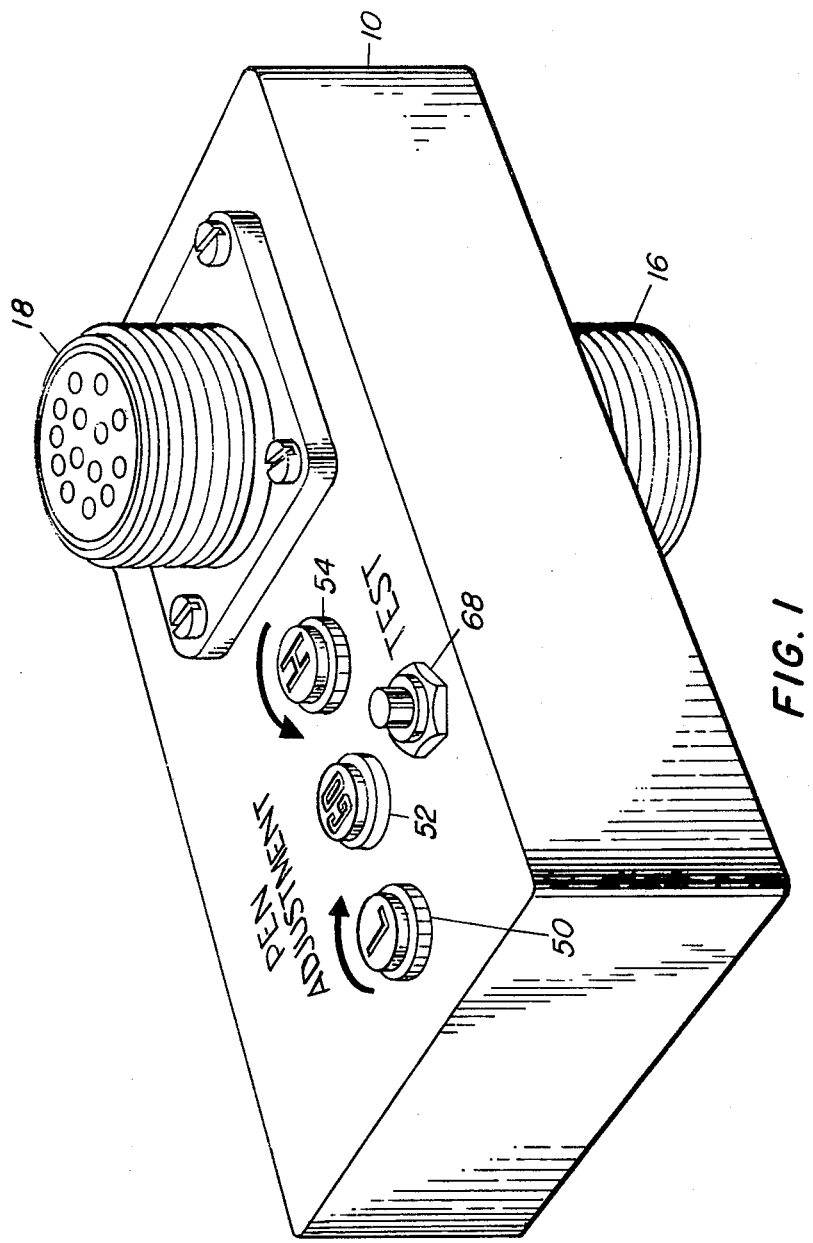
FIG. 1 is an isometric view of the test box which is connected intermediate the power supply unit and the receiver/transmitter unit.
Figure 2:
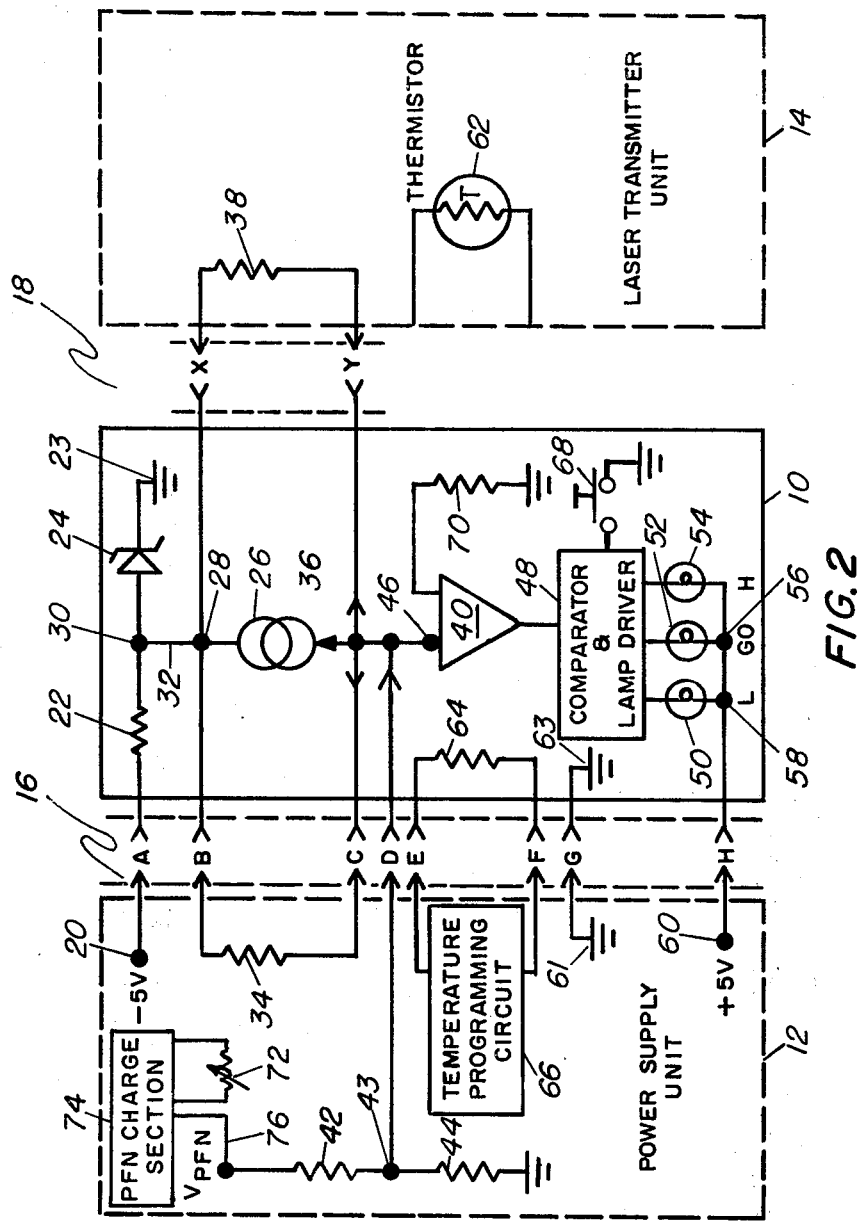
FIG. 2 is a block diagram of the circuitry contained within the test box and the associated laser equipment.

Referring now to FIGS. 1 and 2, test box housing 10 is connected intermediate tank power supply unit 12 and tank laser receiver/transmitter unit 14 through a first electrical connector 16 and second connector 18 respectively. A -5V voltage bus terminal 20 is coupled through electrical connector plug-jack "A" to a current limiting resistance 22 which is in turn connected to chassis ground 23 through a Zener diode 24. Resistance 22 and Zener diode 24 regulate a constant negative voltage for use by the circuit elements of test box 10. A constant current source 26 has a first output terminal 28 connected intermediate limiting resistance 22 and Zener diode 24 at junction point 30 by electrical conductor 32. A pulse forming network resistor 34 is electrically coupled to current source first output terminals 28 and second output terminal 36 through connector 16 plug-jacks B and C. In a similar manner a "select" resistor 38 is electrically coupled to current source output terminals 28 and 36 through connector 18 plug-jacks X and Y. The resistance value of PFN resistor 34 is chosen so that it corresponds to the PFN capacitance of the laser power supply unit 12. The chosen value of resistance 34 is to correct for unit-to-unit capacitance variations which would affect laser energy. The value of the "select" resistor 38 corresponds to a measured laser receiver/transmitter efficiency for the particular unit, and is chosen to correct for unit-to-unit efficiency variations which would affect laser output power. Constant current supply 26 provides a temperature compensated constant reference current to an operational amplifier 40 at amplifier input terminal 46. The current source 26 sums the currents flowing through resistances 34 and 38, and from the junction point 43 of voltage divider resistances 42 and 44 located in power supply unit 12, via connector 16 plug-jack D, at input terminal 46 of operational amplifier 40. The output of operational amplifier 40 is electrically coupled to a comparator and lamp driver circuit 48. The output of the comparator-driver circuit 48 is connected to a first indicator lamp 50, a second lamp 52 and a third lamp 54 which show whether the PFN voltage condition is low (L), satisfactory (Go) or high (H) respectively and indicate the necessary action, if any, to be taken. Common lamp junction points 56 and 58 are electrically connected to the power supply +5 volt bus terminal 60 through connector plug-jack H. Electrical connection through plug-jacks A and H to the aforedescribed voltage terminals eliminates the need for external power to test box 10. The power supply 12 chassis ground 61 is connected to the test box 10 chassis ground 63 through connector 16 plug-jack G. A thermistor 62, located in receiver/transmitter unit 14, is normally used in conjunction with the temperature programming circuit 66 to sense change in ambient temperature and to vary the PFN voltage to keep the laser output energy constant. In the test apparatus 10, the thermistor 62 is bypassed during pulse forming network voltage adjustment, and substituted in its place is a bypass resistor 64, which is electrically coupled to the temperature programming circuit 66 by connector 16 plug-jacks F and G. The resistance value of resistor 64 is chosen so that the temperature programming circuit 66 regulates the PFN charge power supply for its nominal voltage at 25°C regardless of the environmental temperature. A normally open test switch 68 upon being depressed illuminates lamps 50, 52 and 54 to insure that they are operational. Resistance 70 provides an external feedback path for amplifier 40. Operational amplifier 40 sums the currents at its input 46 and is regulated to change its output state for different input polarities. Thus if there is a net current flowing into amplifier 40, lamp 54 will light indicating that the PFN voltage adjustment is too high, and that potentiometer 72 shown on FIG. 2 should be readjusted. Potentiometer 72 in the power supply unit 12 controls the PFN voltage by means of the voltage control circuitry in the PFN charge section 74 via conductor 76 which is connected to junction point $V_{PFN}$. If the net current is flowing out of amplifier 40, the lamp 50 will light indicating that the PFN voltage adjustment is too low, and that potentiometer 72 should be readjusted. In the event that no current is flowing through amplifier 40, the lamp 52 will indicate that the pulse forming voltage is properly adjusted. The comparator and lamp driver 48 senses the low, high and null signals generated by the amplifier and in turn will activate indicating lamps 50, 54 and 52 respectively.

In operation the pulse forming network voltage adjust procedure requires that test box connectors 16 and 18 be connected to plug-jacks A - H and X, Y respectively. After power supply unit 12 is turned on the test operator looks at indicator lamps 50, 52 and 54 to determine how many test box lights are lighted. If no lamps are lighted, test switch 68 is momentarily pushed. If more than one lamp is lighted or no lamps are lighted, the test box unit is in need of repair and/or indicator lamp replacement. In the event that the L indicator lamp is lighted the potentiometer adjustment 72 should be rotated in the direction indicated until the green "Go" lamp 52 just becomes lighted. If the "Go" lamp 50 remains lighted the test box may be disconnected. However, if the "Go" lamp is extinguished the potentiometer adjustment should be turned in the direction indicated until the "Go" lamp 50 again becomes lighted. In a similar fashion if initially after pushing the test switch 68 the H indicator lamp 54 is lighted the potentiometer adjustment 72 should be rotated in the direction indicated until the "Go" lamp 52 just becomes lighted. As stated above, if the "Go" lamp 50 then remains lighted the test box device 10 may be disconnected with the assurance that the pulse forming voltage adjustment is correct for proper laser output.

While there has been described and illustrated specific embodiments of the invention, it will be obvious that various changes, modifications and additions can be made herein without departing from the field of the invention which should be limited only by the scope of the appended claims.

Having thus fully described the invention, what is claimed as new and desired to be secured by Letters Patent of the United States is:

1. A test apparatus for adjusting a pulse forming network voltage of a tank laser range finder system without requiring a laser to be test fired after said range finder has had its power supply and/or receiver/transmitter unit repaired or replaced which comprises:
   housing means for holding circuit components of said test apparatus;
   connector means for electrically and mechanically coupling said circuit components of said housing means to said range finder system;
   a pulse forming network resistor being positioned in said power supply and electrically coupled to said test apparatus via said connector means;
   a "select" resistor being positioned in said receiver/transmitter unit and electrically coupled to said test apparatus via said connector means;
   means for regulating a constant negative voltage;

means for providing a constant reference current which sums the currents through said network resistor, said "select" resistor and from said power supply;

operational amplifier means, connected to the output of said constant current means, for summing the currents at its input terminal and for changing output states for different input polarities;

comparator and lamp driver means electrically coupled to the output of said operational amplifier means for sensing low, high and null signals generated by said operational amplifier means and generating output signals in response thereto;

resistance means for replacing a bypassed thermistor located in said receiver/transmitter unit, wherein said resistance means when electrically coupled by said connector means to a temperature programming circuit in said power supply unit keeps said laser power supply unit adjusted for a 25° C nominal voltage point; and indicating means for providing a visual signal in response to the output signals of said comparator and lamp driver means.

2. A test apparatus as recited in claim 1 wherein said connector means comprises:

a first electrical connector having a plurality of jacks A - H therein, wherein said jack A is electrically connected on one end to said means for regulating said constant negative voltage and on its other end to a −5 volt source, said B and C jacks being electrically connected on one end to the first and second output terminals respectively of said means for providing a constant reference current and on their other ends electrically connected across said network resistor, said jack D being electrically connected on one end to said input terminal of said operational amplifier means and on its other end intermediate a voltage divider located in said power supply unit, said jacks E and F being electrically connected on one end to said resistance means for replacing said thermistor and on their other ends to a temperature programming circuit located in said power supply circuit, said jack G being electrically connected to the chassis ground of said test apparatus and the other end to the chassis ground of said power supply unit, said jack H being electrically connected on one end to a common junction point on said indicating means and on its other end to a +5 volt voltage source; and a second electrical connector having a pair of X and Y jacks therein, said jacks X and Y being electrically connected on one end to the first and second output terminals respectively of said means for providing a constant reference current and on their other ends across said "select" resistor.

3. A test apparatus as recited in claim 1 wherein said network resistor comprises a resistor having a resistance value corresponding to a measured pulse forming network value of capacitance of said power supply unit.

4. A test apparatus as recited in claim 1 wherein said "select" resistor comprises a resistor having a resistance value corresponding to a measured value of laser efficiency of said receiver/transmitter unit.

5. A test apparatus as recited in claim 1 wherein said indicating means comprises:

a first indicator lamp electrically coupled to the output of said comparator and lamp driver means, said first lamp indicating when said pulse forming network voltage is adjusted too low;

a second indicator lamp electrically coupled to the output of said comparator and lamp driver means, said second lamp indicating when said pulse forming network voltage is satisfactory;

a third indicator lamp electrically coupled to the output of said comparator and lamp driver means, said third lamp indicating when said pulse forming network voltage is adjusted too high; and a test switch electrically connected to said comparator and lamp driver means for initiating said test apparatus to indicate whether said first, second or third indicator lamps need repair, to indicate whether said test apparatus is properly working, and to indicate the proper setting of the pulse forming network voltage.

* * * * *